(12) United States Patent
Young

(10) Patent No.: US 7,242,145 B2
(45) Date of Patent: Jul. 10, 2007

(54) COLOR ELECTROLUMINESCENT DISPLAY DEVICES

(75) Inventor: Nigel D. Young, Redhill (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 31 days.

(21) Appl. No.: 10/559,359

(22) PCT Filed: Jun. 4, 2004

(86) PCT No.: PCT/IB2004/001883

§ 371 (c)(1),
(2), (4) Date: Dec. 6, 2005

(87) PCT Pub. No.: WO2004/109641

PCT Pub. Date: Dec. 16, 2004

(65) Prior Publication Data

US 2006/0273998 A1    Dec. 7, 2006

(30) Foreign Application Priority Data

Jun. 11, 2003    (GB) ................................. 0313460.8

(51) Int. Cl.
*G09G 3/30* (2006.01)
*G09G 3/32* (2006.01)

(52) U.S. Cl. .................... 315/169.3; 345/76; 345/83

(58) Field of Classification Search ............. 315/169.3; 345/33, 36, 39, 45, 46, 76, 82, 83
See application file for complete search history.

(56) References Cited

U.S. PATENT DOCUMENTS

| | | | |
|---|---|---|---|
| 6,515,428 B1 * | 2/2003 | Yeh et al. ................ | 315/169.3 |
| 6,812,650 B2 * | 11/2004 | Yasuda et al. ........... | 315/169.1 |
| 2003/0234759 A1 * | 12/2003 | Bergquist .................... | 345/92 |
| 2004/0017162 A1 * | 1/2004 | Sato et al. ................ | 315/169.3 |
| 2005/0030268 A1 * | 2/2005 | Zhang et al. ................. | 345/83 |

* cited by examiner

*Primary Examiner*—Thuy Vinh Tran

(57) ABSTRACT

A colour active matrix electroluminescent (EL) display device has an array of pixels (10) comprising sets of red, green and blue emitting pixels, each of which pixels comprises an EL display element (20), a drive transistor (22) for driving a current through the display element, a storage capacitor (24) for storing a voltage used for addressing the drive transistor, and a discharge photosensitive element (40, 42) for discharging the storage capacitor in dependence on the light output of the display element. The discharge photosensitive elements (42) in the set of blue pixels comprise lateral photosensitive thin film devices, such as lateral thin film transistors or gated or ungated lateral photodiode devices, while the discharge photosensitive elements (40) in the set of red pixels, and preferably the set of green pixels as well, comprise vertical p i n photodiodes (40). The selection of the photosensitive elements in this manner leads to enhanced colour-related photo-sensitivity, and thus improved display device performance.

5 Claims, 4 Drawing Sheets

COLOR ELECTROLUMINESCENT DISPLAY DEVICES

This Application is a National Stage Application of International Patent Application No. PCT/IB04/01883 filed on Jun. 04, 2004, which claims foreign priority to United Kingdom Application No. 0313460.8 filed on Jun. 11, 2003.

This invention relates to colour electroluminescent display devices, particularly active matrix display devices having an array of pixels comprising light-emitting electroluminescent display elements and thin film transistors. More particularly, the invention is concerned with a colour active matrix electroluminescent display device whose pixels include light sensing elements which are responsive to light emitted by the display elements and used to control energisation of the display elements.

Colour matrix display devices employing electroluminescent, light-emitting, display elements are well known. The display elements commonly comprise organic thin film electroluminescent elements, (OLEDs), including polymer materials (PLEDs), or else light emitting diodes (LEDs). For a full colour display, the array typically comprises three sets of pixels whose display elements emit respectively red, green and blue light.

The display elements in such display devices are current driven and a conventional, analogue, drive scheme involves supplying a controllable current to the display element. Typically a current source transistor is provided as part of the pixel configuration, with the gate voltage supplied to the current source transistor determining the current through the electroluminescent (EL) display element. A storage capacitor holds the gate voltage after the addressing phase. An example of such a pixel circuit is described in EP-A-0717446. Each pixel thus comprises the EL display element and associated driver circuitry. The driver circuitry has an address transistor which is turned on by a row address pulse on a row conductor. When the address transistor is turned on, a data voltage on a column conductor can pass to the remainder of the pixel. In particular, the address transistor supplies the column conductor voltage to the current source, comprising the drive transistor and the storage capacitor connected to the gate of the drive transistor. The column, data, voltage is provided to the gate of the drive transistor and the gate is held at this voltage by the storage capacitor even after the row address pulse has ended. The drive transistor in this circuit is implemented as a p-channel TFT (thin film transistor), so that the storage capacitor holds the gate-source voltage fixed. This results in a fixed source-drain current through the transistor, which therefore provides the desired current source operation of the pixel. The pixels can be energized for an extended drive period, up to a frame time, following their addressing, with the data signal stored in the addressing period determining the output level of the pixel in the subsequent drive period.

In the above basic pixel circuit, differential aging, or degradation, of the LED material can give rise to variations in image quality across a display. Improved voltage-addressed pixel circuits which can compensate for the aging of the LED material have been proposed. These include a light sensing element which is responsive to the light output of the display element and acts to leak stored charge on the storage capacitor in response to the light output, so as to control the integrated light output of the display element during the drive period which follows the initial addressing of the pixel. Examples of this type of pixel configuration are described in detail in WO 01/20591. In an example embodiment, a photodiode in the pixel discharges the gate voltage stored on the storage capacitor and the EL display element ceases to emit when the gate voltage on the drive transistor reaches the threshold voltage, at which time the storage capacitor stops discharging. The rate at which charge is leaked from the photodiode is a function of the display element output, so that the photodiode serves as a light-sensitive feedback device. In another example embodiment a photo-responsive TFT is included in each pixel to perform a similar function. An example construction of such an optical feedback type pixel circuit in which the light sensing element comprises a vertical structure p i n type photodiode is described in PCT Patent Application IB03/03484 (PHGB 020139). An example construction of a pixel circuit in which the light sensing element comprises a lateral gated photosensitive thin film device such as a lateral TFT or a lateral gated p i n device, is described in WO 01/99191.

With this arrangement, the light output from a display element independent of the EL display element efficiency and aging compensation is thereby provided. Moreover, the pixel circuit is also able to compensate for the effects of voltage drops which can occur in the current carrying lines supplying the pixels. Reference is made to the paper "A comparison of pixel circuits for Active Matrix Polymer/Organic LED Displays" by D. A. Fish et al., 32.1, SID 02 Digest, May 2002.

Such a technique can be effective in improving the quality of the display such that it suffers less non-uniformities. However, it has been found that problems with the quality of display achieved can still be apparent, particularly with different colour pixels showing different behaviours.

It is an object of the present invention to provide an improved colour display device using pixel circuits of the above described type in which such problems are reduced.

According to one aspect of the invention, there is provided a colour active matrix electroluminescent display device comprising an array of display pixels, each pixel comprising:

an electroluminescent display element;
a drive transistor for driving a current through the display element;
a storage capacitor for storing a voltage to be used for addressing the drive transistor;
a discharge photosensitive element for discharging the storage capacitor in dependence on the light output of the display element;
wherein the array comprises sets of red, green and blue pixels whose display elements emit respectively red, green and blue colour light, and wherein the discharge photosensitive elements of the red set of pixels comprise vertical p i n photodiodes and the discharge photosensitive elements of the blue set of pixels comprise lateral photosensitive thin film devices.

Such a display device provides significantly improved pixel sensitivity for all pixel colour wavelengths, giving improved correction against degradation for pixels of all colours. The invention results from an appreciation that the use in the known devices of the same type of photosensitive elements in all pixels of the array does not reliably provide the expected improvement and can lead to different results for differently coloured pixels. These differences are caused by the spectral behaviour of the photosensitive elements employed and, more particularly, variations in their efficiency in response to different light colours. Lateral gated photosensitive devices, such as TFTs, are less efficient when operating with red light compared with blue or green light due to their use of thin film layers, and so in a display device using such the operational characteristics of red pixels differ from those of the blue and green pixels. Vertical p i n diode structures, on the other hand, comprise comparatively thick structures and provide good response to red light. However, these devices tend to exhibit poorer efficiency in response to blue light. This is due to the tendency in these devices for blue colour light to be absorbed in the top surface region, comprising the p contact layer, (assuming this region is arranged facing the electroluminescent light emitting layer of the display element from which it receives light), and does not therefore contribute to the photocurrents. Consequently, the blue pixels in display devices employing such photosensitive elements can be expected to behave differently to the red and green pixels, and, as a consequence of the reduced efficiency of the photodiodes to the light, will tend to suffer an increase in ageing.

As the response characteristic of a p i n photodiode for green light tends to be better, then vertical p i n photosensitive elements are preferably also used in the green set of pixels rather than the lateral type.

Thus, by using the appropriate type of photosensitive element for a pixel according to the colour of the light with which it operates, enhanced colour-related photosensitivity is obtained and a significant improvement in display device performance achieved.

The lateral thin film photosensitive devices may be gated devices, such as lateral TFTs or gated lateral photodiode devices, or ungated devices, such as lateral photodiode devices or photoresistors. The gated kind of device may be beneficial in certain kinds of pixel circuit where the gate is controlled to ensure that the device is held in its off state.

An embodiment of a colour active matrix electroluminescent display device in accordance with the present invention will now be described. By way of example, with reference to the accompanying drawings, in which.

It will be appreciated that the figures are merely schematic and are not drawn to scale. The same reference numerals are used throughout the figures to denote the same or similar parts.

Figure 1:
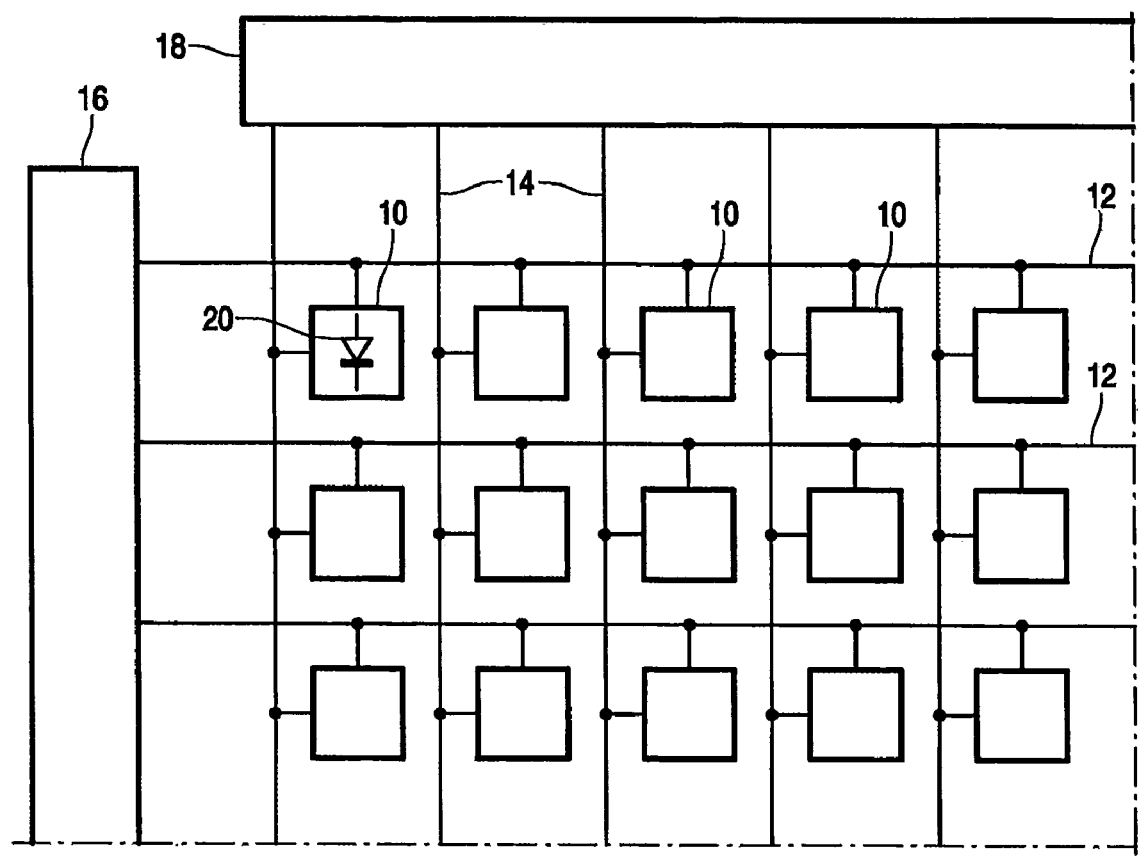
FIG. 1 is a simplified schematic diagram of part of an embodiment of colour active matrix electroluminescent display device according to the invention.

Referring to FIG. 1, the colour active matrix electroluminescent display device comprises a panel having a row and column matrix array of regularly-spaced display pixels, denoted by the blocks 10, each display pixel comprising a display element and an associated driving device controlling the current through the display element, and being located at respective intersection between crossing sets of row (selection) and column (data) address conductors, or lines, 12 and 14. Only a few pixels are shown here for simplicity. The pixels 10 are addressed via the sets of address conductors by a peripheral drive circuit comprising a row, scanning, driver circuit 16 and a column, data, driver circuit 18 connected to the ends of the respective conductor sets. In operation, each row of pixels is addressed in turn in a frame period by means of a selection signal applied by the circuit 16 to the relevant row conductor 12 so as to load the pixels of the row with respective data signals which determine their individual display outputs in a frame period following the addressing period, according to the respective data signals supplied in parallel by the circuit 18 to the column conductors. As each row is addressed, the data signals are supplied by the circuit 18 appropriately in synchronisation.

Each pixel 10 includes a light emitting organic electroluminescent (EL) display element 20 comprising a pair of electrodes between which one or more active layers of organic electroluminescent light-emitting material are disposed. In this particular embodiment the material comprises a polymer LED material, although other organic electroluminescent materials, such as low molecular weight materials, could be used. The display elements of the array are carried, together with the associated active matrix circuitry, on the surface of an insulating substrate. The substrate is of transparent material, for example glass, and the electrodes of the individual display elements 20 closest to the substrate consist of a transparent conductive material such as ITO so that light generated by the electroluminescent layer is transmitted through these electrodes and the substrate so as to be visible to a viewer at the other side of the substrate. Alternatively, the pixels could be arranged to emit light away from the substrate.

The pixel array comprises three sets of pixels whose EL display elements respectively emit light of three different colours, namely red (R), green (G), and blue (B) light, the differently coloured pixels being organized in respective columns.

Figure 2:
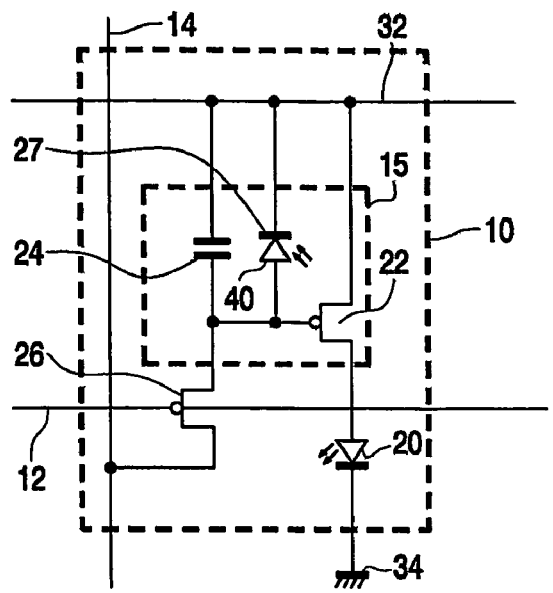
FIG. 2 shows the equivalent circuit of a typical pixel of one colour in the device of FIG. 1.

Each pixel includes drive circuitry to implement an optical feedback control technique, in this case as described for example in WO 01/20591 to which reference is invited and whose disclosure is incorporated herein by reference. This circuitry includes a discharge photosensitive element responsive to the light emitted by the EL display element of the pixel concerned in operation. Unlike the display devices described in the aforementioned publication, however, and in accordance with the invention, the display device of FIG. 1 uses different types of photosensitive elements according to the different colours of pixels in the array, FIG. 2 illustrates the drive circuitry of a typical one of the pixels in the array, the pixel being one of those which generates either red or green colour light output, and which drive circuitry provides voltage-addressed operation. The EL display element 20 is connected in series with a drive transistor 22 between a power supply line 32, shared by all pixels in the same row, and a common, ground, line 34, comprising a cathode layer common to all display elements 20 in the array. The drive circuitry includes an address transistor (TFT) 26 which is turned on by a row address pulse applied to the row conductor 12. When turned on, a data voltage on the column conductor 14 can pass to the remainder of the pixel circuitry. In particular, the address transistor 26 supplies the column conductor voltage to a current source 15 which comprises the drive transistor 22 and a storage capacitor 24 connected between the gate node of the transistor 22 and the power supply line 32. The column voltage is therefore provided to the gate of the drive transistor 22 and the gate is held at this voltage by the storage capacitor 24 even after the row address pulse has terminated. The drive transistor 22 is here implemented as a p-channel thin film transistor, TFT, so that the capacitor 24 holds the gate—source voltage fixed. This results in a fixed source—drain current through the transistor 22, which then provides the desired current source operation of the pixel.

In order to compensate for the effects of aging of the LED material the discharge photosensitive element 27 included in the pixel drive circuitry is responsive to the light output of the display element 20 and acts to leak stored charge on the storage capacitor 24 in response to that light output so as to control the integrated light output of the display element during the period following addressing. Here the photosensitive element 27 comprises a vertical structure p i n photodiode 40 connected in parallel with the storage capacitor 24 between the gate node of the transistor 22 and the line 32, and with its cathode connected to the line 32 such that it is reverse biased. As a result of photocurrents generated in response to light input, the photosensitive element discharges the gate voltage stored on the capacitor 24 and the EL display element 20 will no longer emit when this gate voltage reaches the threshold voltage level of the transistor 22. The rate at which charge is leaked from the element 27 is a function of the display element light output, so that the element functions as a light sensitive feedback device.

Figure 3:
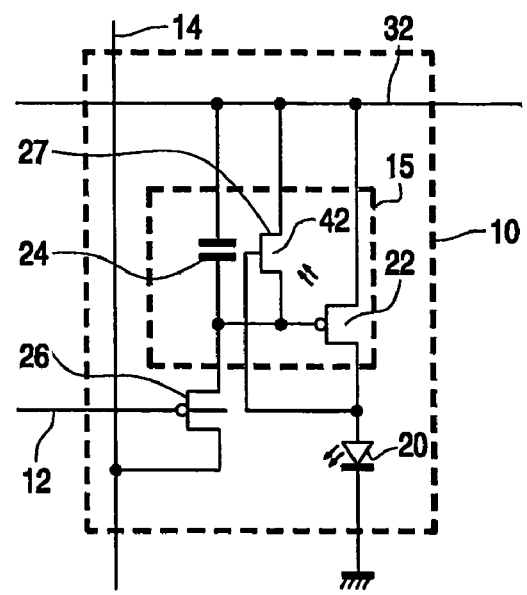
FIG. 3 shows the equivalent circuit of a typical pixel of another colour in the device of FIG. 1.

FIG. 3 illustrates the drive circuitry of a typical one of the blue colour pixels in the array. The pixel circuit is similar to that of FIG. 2 except that here the discharge photosensitive element 27 comprises a lateral gated photosensitive thin film device 42. The device 42 in this embodiment comprises a lateral structure thin film transistor (TFT) of similar form to, and fabricated simultaneously with, the TFTs 26 and 22. Unlike the TFT 22 however, the TFT 42 is an n-channel device. The current carrying, source and drain, electrodes of this TFT 42 are connected across the storage capacitor 24, between the line 32 and the gate node of TFT 22. The gate of the TFT 42 is connected to the node between the TFT 22 and the anode of the display element 20.

As with the photodiode 40 of the pixel of FIG. 2, the TFT 42 is arranged so that it is exposed to light emitted by the display element 20 in operation and is responsive to such light to leak stored charge on the storage capacitor 24 so as to control the integrated light output of the display element 20 during the period which follows the pixel addressing phase. The drain junction of the TFT 42 coupled to the line 32 is reverse biased and photo-responsive whereby light from the display element 20 falling thereon results in a small photocurrent being produced in the TFT 42 which is approximately linearly proportional to the display element's instantaneous light output level. The gate of the TFT 42 is biased with its voltage being zero or negative with respect to the gate node of the TFT 22 and negative with respect to the line 32 such that it is held in the off (non-conductive) state. Accordingly the TFT 42 behaves simply as a leakage device in the manner of a reverse biased photodiode, like the photodiode 40 of the FIG. 4 circuit arrangement. The use of such a gated photosensitive thin film device in an optically—controlled EL pixel circuit, and the manner of the construction, are described in WO 01/99191 to which reference is invited.

With regard to the pixel circuits of both FIGS. 2 and 3, then the rate of discharge of the storage charge on the storage capacitor 24 is a function of the light output of the display element 20. It can be shown that the integrated light output, $L_T$, of a display element 20 under the optical feedback control of such a drive circuit is given, approximately, by:

$$L_T = \frac{C_s}{n_{PD}}(V(o) - V_T)$$

where $n_{PD}$ is the efficiency of the photosensitive element 27, Cs is the capacitance of the storage capacitor 24, V(o) is the initial gate—source voltage of the drive TFT 22, and $V_T$ is the threshold voltage of the drive TFT 22. The light output is therefore independent of the display element efficiency, and consequently compensation for ageing can be achieved.

The efficiencies of the photosensitive elements 27 are dependent on the colour of light with which they operate. In this respect, gated lateral thin film devices 42 tend to exhibit poorer efficiency in the red region of the spectrum, because they consist of thin film layers. On the other hand, relatively thick, vertical p i n photodiodes are capable of comparatively high efficiency in response to red light. However, the response to blue light of these devices can be poor, principally as a result of blue light being absorbed to a significant extent in the surface region, that is, the p (or n) contact layer receiving the incoming light, where it does not contribute to the generated photocurrent.

Thus, by using different types of photosensitive elements, for different colour pixels, with the lateral gated thin film devices 42 being used in the blue emitting pixels and vertical p i n photodiodes being used in the red and green emitting pixels, the efficiencies of the photosensitive elements are appropriately selected according to the pixel colour with which they operate to give significantly improved results as regards the performance of all colour pixels compared with the case where the same type of photosensitive element is used for all pixels throughout the array.

Figure 4:
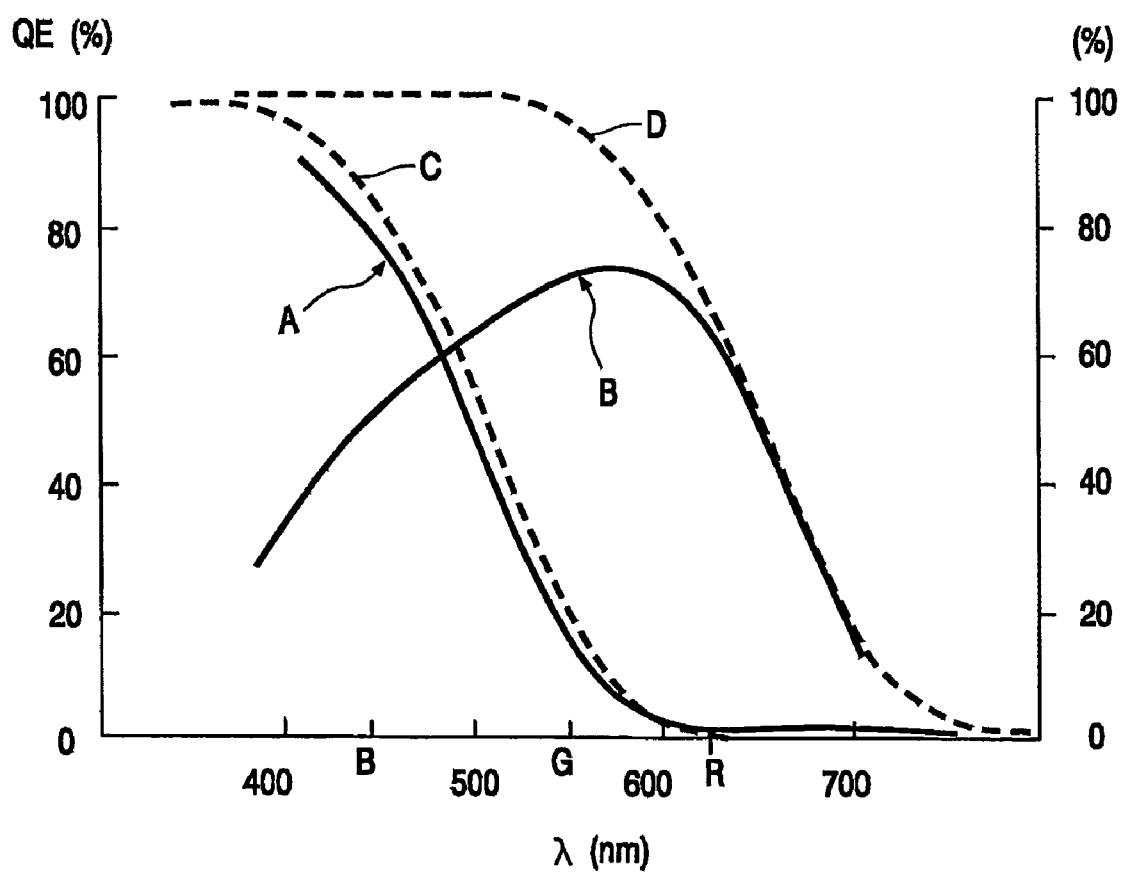
FIG. 4 is a graph illustrating the behavioural characteristics of the first and second types of photosensitive elements.

The benefit of using different types of photosensitive for different colour pixels is demonstrated graphically in FIG. 4 in which the quantum efficiency, QE, of a lateral TFT photosensitive device having an active silicon layer thickness, that is, the thickness of the n-i-n or (p-i-p) semiconductor layer of the TFT 42, of approximately 0.04 µm, against wavelength, λ, is shown by the curve A, and in which the quantum efficiency, QE, of a vertical p i n photodiode having an i region layer thickness of around 1 µm, against wavelength, λ, is shown by the curve B. R, G and B signify the approximate wavelengths of the red, green and blue light emissions from the pixels. As can be seen, the quantum efficiency of the vertical p i n element peaks between the red and green wavelengths, whereas the quantum efficiency of the lateral TFT is higher at around the blue wavelength, and considerably higher than that obtained by the photodiode element at this wavelength. Also shown in the graph, by the dotted curves C and D, are the absorptions, A, in a thin silicon film, such as the i layer of the lateral TFT or vertical p i n photodiode, of light of different wavelengths, λ, in the case of a film thickness of around 1 µm, curve D.

Figure 5:
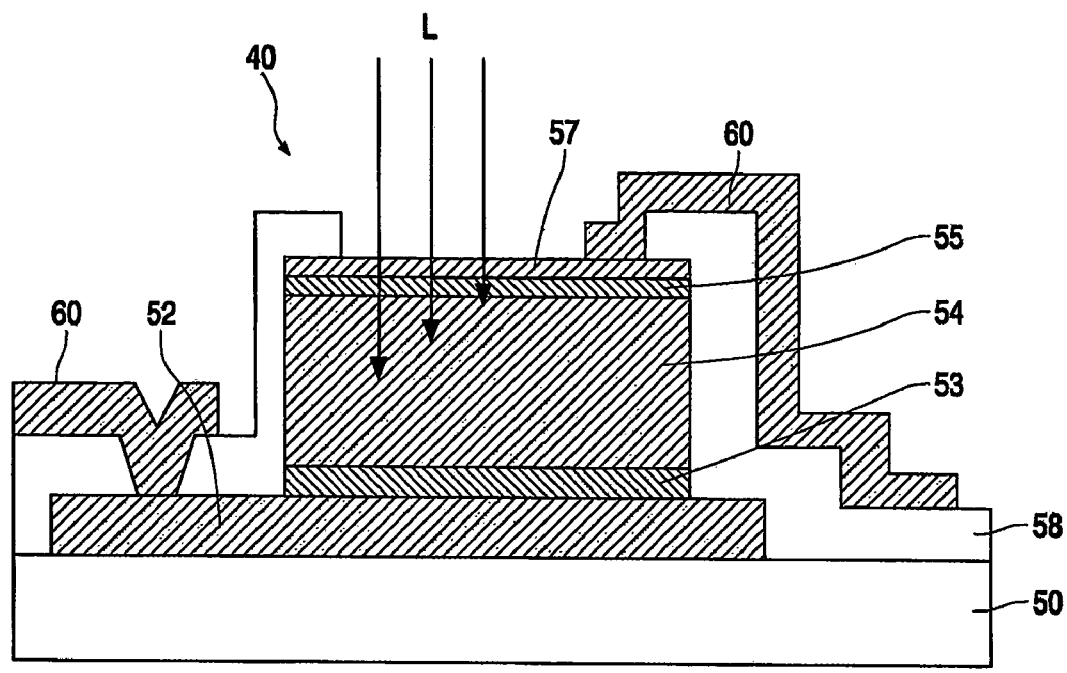
FIGS. 5 and 6 show schematically in section example structures of first and second types of photosensitive elements used in the pixels of the FIGS. 2 and 3 respectively.
Figure 6:
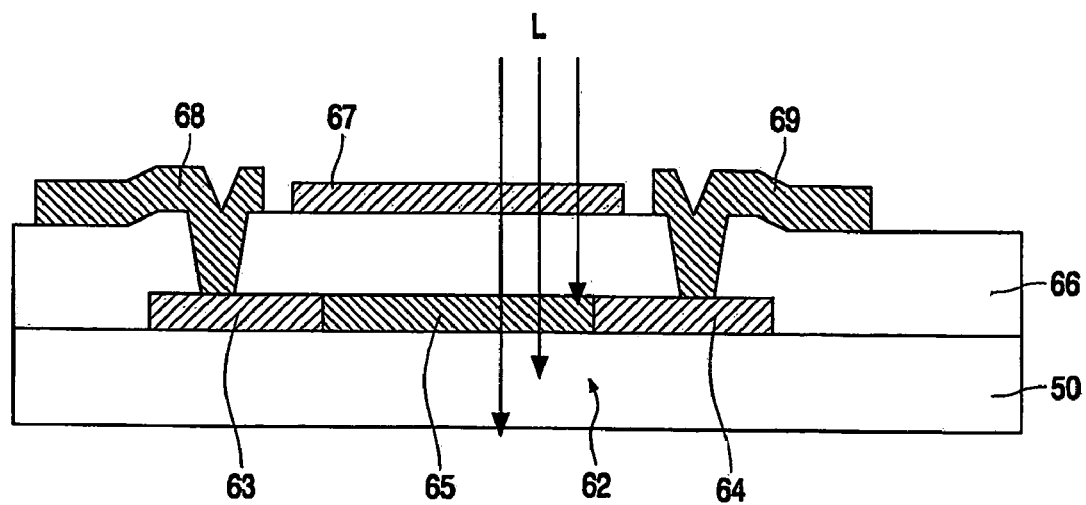

FIGS. 5 and 6 shows respectively, and schematically, examples of the structures of a vertical p i n photodiode 40 and a lateral gated thin film device (TFT) as used in the pixels of the display device of FIG. 1.

Referring to FIG. 5, the photodiode 40 is carried on a substrate 50, which may be the glass substrate of the display device or an insulating layer carried on that substrate, and fabricated over a metal layer 52 providing contact to the bottom electrode of the element. The photodiode element comprises a p-i-n structure formed from successively deposited, and vertically stacked, thin film hydrogenated amorphous silicon (sub) layers with the lowermost layer 54, comprising n doped material, formed directly on the metal layer 52, and the p doped layer 55 being uppermost. The p layer 55 is covered by a transparent electrically conductive layer 57, for example of ITO. The photodiode structure is surrounded by an insulating layer 58 except for a major part of the layer 57 so that input light, as represented by the arrow L, can enter the photodiode structure. Electrical connection to the photodiode is achieved by means of respective portions of an upper metal layer 60 which contact the ITO layer 57 and, through an opening formed in the insulator layer 58, the lower metal layer 52. Typically, the thickness of the intermediate intrinsic, i, layer 54 of the photodiode structure is around 0.2 to 1.5 μm in thickness and the upper p layer 55 is around 5 to 20 nm in thickness. Only light absorption in the i layer 54 generates photocurrent. Blue light is largely absorbed in the upper p layer 55.

Referring to FIG. 6, the lateral gate photosensitive thin film device 42, in the form of a TFT, is carried on the substrate 50 and comprises a deposited thin film layer of polycrystalline silicon 62 which is formed by appropriate n type doping at its end regions to create laterally spaced source and drain regions 63 and 64, with an intrinsic semiconductor region 65 between the regions 63 and 64. A gate insulator layer 66 is provided over the semiconductor layer 62 and a gate electrode 67, of transparent electrically conducting material such as ITO, formed on this layer 62 overlying the intrinsic region 65. Electrical connection to the source and drain electrodes 63 and 64 is provided by metal layer portions 68 and 69 extending through the gate insulator layer 65. Typically with this kind of lateral TFT structure the thickness of the semiconductor layer 52 is around 40 nm. At such a thickness, practically all blue light incident on the intrinsic region 65 is absorbed while relatively little red and green light is absorbed.

The TFT structure of the element 42 could instead be formed using hydrogenated amorphous silicon material.

For a more detailed description of pixel configurations and the manner of fabricating the pixel array using such photosensitive elements reference is invited for examples, to the aforementioned WO 01/99191, concerning pixels utilising lateral gated photosensitive thin film elements, and PCT Patent Application IB03/03484 concerning devices having pixels utilising vertical amorphous silicon p i n photodiode elements together with polysilicon TFTs.

With regard to the above-described device, the pixel array may include a further set, or sets, of pixels emitting light of a different wavelength to the other three sets. The photosensitive element of the pixel circuits of this further set provides the most appropriate sensitivity with that wavelength.

Although in the embodiment described above, a gate lateral photosensitive thin film device, in the form of a n type TFT, is used for the blue pixels, it is envisaged that other gated lateral photosensitive thin film devices, for example p type TFTs, (with a lateral p-i-p structure), or gated lateral photodiode (with a lateral p-i-n structure), and ungated lateral photosensitive thin film devices, such as lateral photodiode devices or lateral photoresistor devices, may be used for such purposes.

With regard to the vertical p i n photodiode 40, it will be appreciated that the structure of this device can be either way up in relation to the substrate, depending on the polarity of the circuit. Similarly, with regard to the pixel circuits using lateral photosensitive devices, polarity reversal of the circuit is possible, in which case p type TFTs may be used.

From reading the present disclosure, other modifications will be apparent to persons skilled in the art. Such modifications may involve other features which are already known in the field of active matrix electroluminescent display devices and component parts therefor and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

The invention claimed is:

1. A colour active matrix electroluminescent display device comprising an array of display pixels (10), each pixel comprising:
   an electroluminescent display element (20);
   a drive transistor (22) for driving a current through the display element;
   a storage capacitor (24) for storing a voltage to be used for addressing the drive transistor;
   a discharge photosensitive element (40, 42) for discharging the storage capacitor in dependence on the light output of the display element;
   wherein the array comprises sets of red, green and blue pixels whose display elements emit respectively red, green and blue colour light, and wherein the discharge photosensitive elements (40) of the red set of pixels comprise vertical p i n photodiodes and the discharge photosensitive elements (42) of the blue set of pixels comprise lateral photosensitive thin film devices.

2. A display device as claimed in claim 1, wherein the discharge photosensitive elements (40) of the set of green pixels comprise vertical p i n photodiodes.

3. A display device as claimed in claim 1, wherein the lateral photosensitive thin film devices (42) comprise gated lateral photosensitive thin film devices.

4. A display device as claimed in claim 3, wherein the lateral photosensitive thin film devices (42) comprise lateral thin film transistors.

5. A display device as claimed in claim 3, wherein the lateral gated photosensitive devices comprises lateral photodiode devices.

* * * * *